(12) United States Patent
Lewis et al.

(10) Patent No.: US 7,898,452 B2
(45) Date of Patent: *Mar. 1, 2011

(54) METHODS AND SYSTEMS FOR CALIBRATING A PIPELINED ANALOG-TO-DIGITAL CONVERTER

(75) Inventors: Donald E. Lewis, Nevada City, CA (US); Rex K. Hales, Riverton, UT (US)

(73) Assignee: Siflare, Inc., Sandy, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/623,815

(22) Filed: Nov. 23, 2009

(65) Prior Publication Data

US 2010/0066575 A1 Mar. 18, 2010

Related U.S. Application Data

(63) Continuation of application No. 12/055,468, filed on Mar. 26, 2008, now Pat. No. 7,688,238.

(51) Int. Cl.
*H03M 1/38* (2006.01)
(52) U.S. Cl. .......................................... 341/161; 341/155
(58) Field of Classification Search .................. 341/155, 341/161, 156, 120
See application file for complete search history.

(56) References Cited

U.S. PATENT DOCUMENTS

| 5,977,894 | A | 11/1999 | McCarroll et al. |
| 6,825,783 | B2 | 11/2004 | You |
| 7,688,238 | B2 * | 3/2010 | Lewis et al. ................. 341/120 |
| 2002/0067297 | A1 | 6/2002 | Donovan et al. |

FOREIGN PATENT DOCUMENTS

KR 10-2005-0086242 A 8/2005

* cited by examiner

*Primary Examiner* — Brian Young
(74) *Attorney, Agent, or Firm* — Steven L. Nichols; Van Cott, Bagley, Cornwall & McCarthy P.C.

(57) ABSTRACT

This method increases accuracy of a pipelined analog-to-digital converter comprising a plurality of stages, each stage comprising an analog-to-digital converter (ADC) and a digital-to-analog converter (DAC). The method includes calibrating each the ADC starting from a least significant stage until all ADCs have been calibrated using a reference digital-to-analog converter, the reference digital-to-analog converter selectively outputting values at desired trip points for each the ADC; measuring an output of each the DAC using downstream stages of the pipelined analog-to-digital converter to produce output measurements; and using the output measurements to calculate an error-corrected output of the pipelined analog-to-digital converter. The trip points are adjusted by modifying a reference current input to a comparator of each the ADC.

11 Claims, 10 Drawing Sheets

METHODS AND SYSTEMS FOR CALIBRATING A PIPELINED ANALOG-TO-DIGITAL CONVERTER

RELATED APPLICATION

The present application is a continuation of and claims priority under 35 U.S.C. §120 from previous U.S. patent application Ser. No. 12/055,468, filed Mar. 26, 2008 and entitled "Methods and Systems for Calibrating a Pipelined Analog-to-Digital Converter," which previous application claimed the priority under 35 U.S.C. §119(e) of U.S. Provisional Patent Application No. 60/920,178, entitled "Methods and Systems for Calibrating a Pipelined Analog-to-Digital Converter," filed Mar. 27, 2007. Both previous applications are hereby incorporated by reference in their respective entireties.

BACKGROUND

In a limitless variety of applications, it is desirable or necessary to convert an analog signal into a digital signal. This will be the case, for example, whenever an analog input is to be processed using digital logic. Consequently, a class of circuits, known as analog-to-digital converters, has been developed to provide the desired signal conversion.

As with many other circuit components, analog-to-digital converters implicate concerns about accuracy, power consumption, physical size, etc. Consequently, there is always value in increasing the accuracy, lowering the power consumption or decreasing the physical size of circuit elements such as analog-to-digital converters.

Historically, engineers have been trained to design circuits in terms of voltage. For example, when performing integrated circuit analysis, designers typically focus on the voltage change at the output of the circuit that occurs as a result of a voltage change that occurs from the input of the circuit. Circuit simulators also follow this approach by constructing matrices of nodes to solve for node voltages. On the test bench, voltage sources are used to operate circuits under test and test equipment is configured to measure voltage.

Over the years, the density of integrated circuits has increased rapidly as component sizes have become smaller. With each reduction in component size, a corresponding reduction in optimal operating voltages occurs. These decreases in operating voltages have required reductions in threshold voltages in order to maintain desired noise margins. Analog circuits, particularly analog-to-digital converters (ADCs) have suffered from this reduction, as they are typically designed with higher voltage transistors and operating voltages than are available to digital designers.

In a typical voltage mode ADC, the voltage being sampled is stored on a capacitor. It can be shown that the minimum size of the capacitor storing the voltage must be $>kT/(V_n^2)$, where k is Boltzman's constant, T is temperature in Kelvin, and Vn is the size of the largest noise signal, usually less than ¼ of the ADC's least significant bit (LSB), that can be tolerated to give a low probability of error. As the operating voltage is reduced due to newer processes, the minimum capacitor size increases. This increases both the size of the circuit and the power used.

The accuracy of a voltage mode circuit, including a voltage mode ADC, is determined by the size of the capacitance used to store the voltage. The speed and power consumption of a voltage mode circuit is consequently affected by circuit capacitance and parasitic capacitance. The nodes of a voltage mode circuit must change voltage during operation of the circuit over a range that is often approximately the entire voltage range of the power supply voltage. Changing to a smaller geometry process increases parasitic capacitances, and due to the smaller voltage swing, larger circuit capacitances must be used, thereby requiring more power to compensate for the reduction in noise margins.

BRIEF DESCRIPTION OF THE DRAWINGS

The accompanying drawings illustrate various embodiments of the principles described herein and are a part of the specification. The illustrated embodiments are merely examples and do not limit the scope of the disclosure.

Throughout the drawings, identical reference numbers designate similar, but not necessarily identical, elements.

DETAILED DESCRIPTION

The present specification describes, among other things, exemplary pipelined analog-to-digital converters (ADCs), and more particularly methods and system for calibrating such pipelined ADCs to increase the accuracy with which an analog signal is converted to a digital signal. While these techniques may apply to either a voltage or current mode ADC, these techniques may particularly be applied to current mode pipelined ADCs that avoid the traditional limitations of voltage mode ADCs described above. As will be described in more detail below, the use of pipelined current mode ADCs is advantageous in many systems and often results in reduced power consumption, fewer components, lower cost, faster operating speeds, simplified layout, and higher accuracy.

In some examples, as will be described in more detail below, a current mode ADC operates, for example, by comparing the current of an input signal to one or more reference currents to create a digital representation of the incoming signal. The ADC described herein may be used in a variety of applications including but not limited to, battery level measurement (metering), communications, imaging, measurement, control systems, sensors, etc.

As described above, traditional circuits are designed in terms of voltage. For example, in the field of analog-to-digital conversion, voltage mode ADCs compare the voltage of an input signal to a number of reference voltages to determine which reference voltage is closest to the voltage of the input signal. A digital representation of the input signal may then be created based on a series of such voltage comparisons.

In contrast, there are several advantages to designing circuits in terms of current. As will be described in more detail below, in current mode ADCs, for example, the current of an input signal may be compared to a plurality of current references to determine which reference current is closest to the current of the input signal. A digital representation of the input signal may then be created based on a series of such current comparisons.

One of the many advantages of this approach is that because current sources are used instead of voltage references, operational voltage becomes far less of a limiting factor. By allowing lower operating voltages to be used, the ADC can take better advantage of the increases in modern integrated circuit density. Also, since the voltages at nodes in a current mode circuit change very little, circuit and parasitic capacitances have much less effect on the speed of the circuit.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Figure 1:
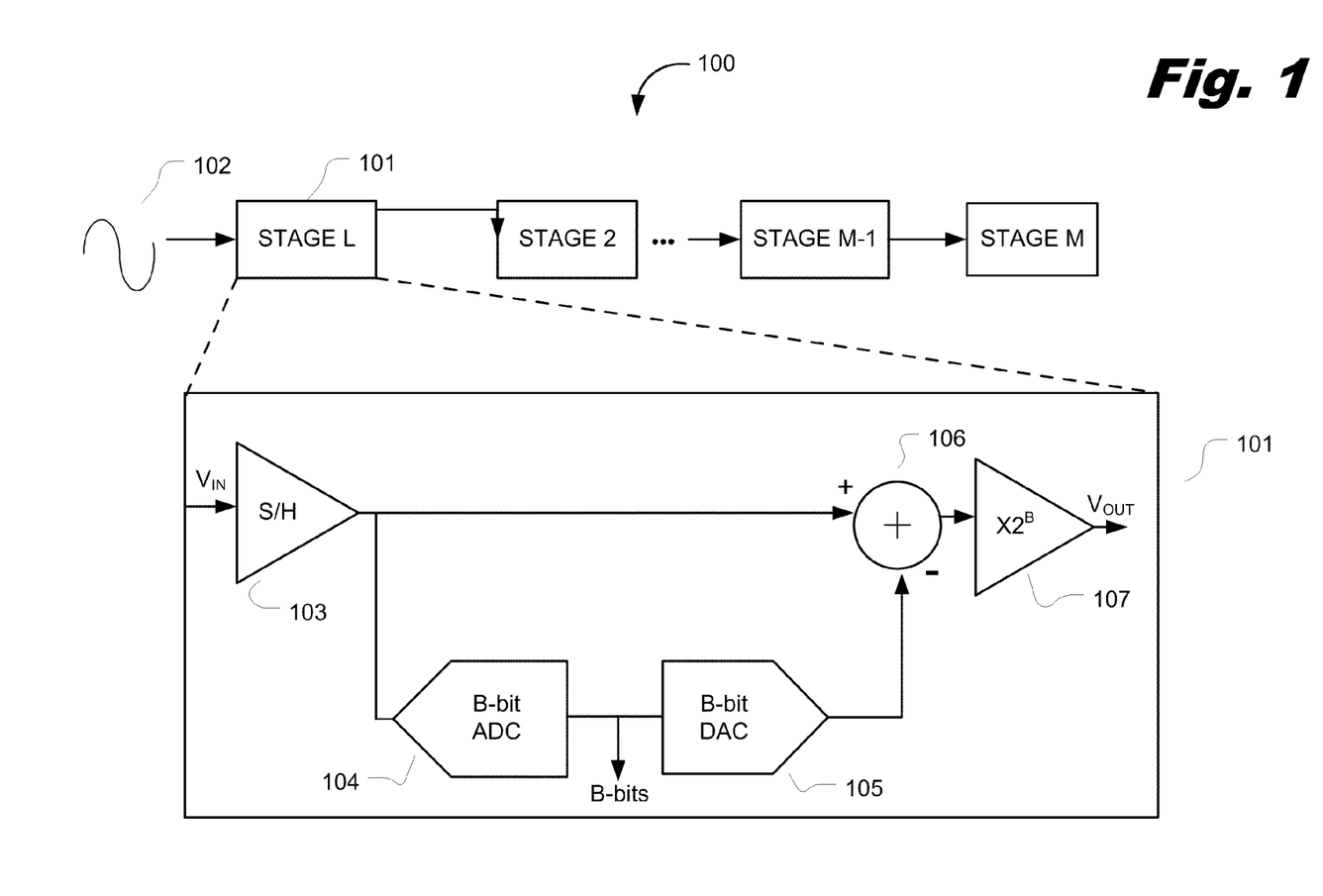
FIG. 1 illustrates an exemplary voltage mode pipelined analog-to-digital converter (ADC) according to principles described herein.

FIG. 1 illustrates an exemplary pipelined ADC (100). As shown in FIG. 1, the pipelined ADC (100) includes a number of stages (101) through which an analog signal (102) is passed. Each stage (101) may include a sample-and-hold circuit (S/H) (103), a B-bit ADC (104), a B-bit DAC (105), a summing block (106), and an amplifier (107).

In some examples, as shown in FIG. 1, the analog input signal (102) is first sampled by the S/H circuit (103). The output of the S/H circuit (103) is then input into a B-bit ADC (104), which outputs a digital signal. A B-bit DAC (105) converts the output of the ADC (104) into an analog signal. The summing block (106) subtracts the output of the DAC (105) from the output of the S/H circuit (103). The result of this subtraction is referred to as a residue signal. The residue signal is then amplified by amplifier (107) and then input into a subsequent stage. The process is repeated in each stage and the digital outputs of the B-bit ADCs (104) within each stage may be combined to achieve a desired resolution. For example, if B in each stage is equal to three, i.e., ADC (104) and DAC (105) are 3-bit converters, then the first stage would produce the three most significant bits, the second stage, the next three most significant bits and so on for as many stages as needed to achieve the desired resolution, often 10-16 bits.

The achievable accuracy of a pipelined ADC as shown in FIG. 1 is limited only by the accuracy of the circuit blocks used in each stage. If an overall accuracy of 14 bits is desired, for example, the accuracy of the first B-bit ADC (104) must be 14 bits, meaning that the input value at which each comparator changes it's output, often called the comparator trip point, must be accurate to <+/−½ the least significant bit (LSB) of the entire ADC (100). In our 14 bit example, if the allowed input voltage range is 1V, the LSB of the entire ADC would be $1V/2^{14}$, or ~61 uV. The accuracy of the B-bit DAC must also be 14 bits. The accuracy of the blocks in following stages is reduced by B.

A number of techniques have been developed for increasing the overall accuracy of an ADC. For example, over-sampling, dithering and digital error correction have gained wide acceptance in improving the noise performance of commercial analog-to-digital converters.

The process of over-sampling to reduce ADC quantization noise is straightforward. An analog signal is digitized at an $f_s$ sample rate that is higher than the minimum rate needed to satisfy the Nyquist criterion (twice the input analog signal's bandwidth) and then lowpass filtered. By increasing the ADC's $f_{s,old}$ sample rate to some higher value $f_{s,new}$ (over-sampling), the total noise power (a fixed value) is spread over a wider frequency range. The total quantization noise power of a converter depends only on the number of bits and not the sample rate. A lowpass filter is placed at the converter's output to reduce the quantization noise level contaminating the signal. Over-sampling can also reduce random noise such as thermal noise on a static input signal. Multiples samples are averaged, and the average of the random component of the signal is 0.

Dithering, the second technique used to minimize the effects of ADC quantization noise, is the process of adding noise to the analog signal prior to analog-to-digital conversion. Dithering results in a noisy analog signal that crosses additional converter LSB boundaries and yields a quantization noise that is much more random, with a reduced level of undesirable spectral harmonics. Dithering raises the average spectral noise floor but increases $SNR_2$. Dithering forces the quantization noise to lose its coherence with the original input signal, which would then result in benefits from averaging, if desired. Dithering is useful when digitizing low-amplitude analog signals, highly periodic analog signals (such as a sinewave with an even number of cycles in the sample time interval), and slowly varying (low-frequency or DC) analog signals.

Additionally, one well-known method to reduce the required accuracy of the B-bit ADC (104) is to reduce the gain of the amplifier (107) to $2^{(B-1)}$. If digital error correction is then used, the least significant bit of the first stage, B-bit ADC is added to the most significant bit of the next stage, B-bit ADC. This "overlap" of bits allows the comparator trip points in the B-bit ADCs to be off by as much as +/−½ LSB of that stage, effectively reducing the accuracy requirement to B bits rather than the accuracy of the entire ADC (100). Referring to the example of a 14 bit ADC above and using 3 bits per stage (B=3), the accuracy requirement of the first 3-bit ADC is reduced to $1V/2^3$, or 125 mV.

Despite these techniques, there is still room for improvement in the overall accuracy of a pipelined ADC. For example, the DAC (105) in each stage of the pipelined ADC (100) can be a source of error that limits overall ADC accuracy. Specifically, with changes in the digital input to the DAC, the DAC will accordingly step up or down the amplitude of the analog signal being output. However, the analog output of the DAC may not step up or down to precisely the expected value based on the change in digital input. For example, when the DAC is given a digital input of 010, the analog output should be exactly twice as large in amplitude (to within ½^n) as when the digital input is 001. If the step size is not within ½^n of the expected value, the result looks like gain error in the output of the pipelined ADC. However, unless manufactured to exacting specifications, the DAC may not step to the expected analog output based on the new digital input. Consequently, an error factor is introduced in the overall conversion being performed.

Moreover, this error is cumulative with each DAC in each stage of the pipelined ADC (100). Consequently, at a minimum the DAC (105) in the first stage of the ADC (100) must have an accuracy that supports the full resolution desired from the entire ADC (100). Making a DAC with such accuracy is both difficult and expensive.

Rather than attempting to build a perfect DAC, the present specification describes a method by which the error factors of each DAC in the pipelined ADC are measured during a calibration process. This is referred to as "characterizing" the DAC. The error factors, e.g., errors in step size and gain errors, are recorded in a look-up table (LUT) during the calibration process. Then, during operation of the pipelined ADC, a digital correction signal based on the data in the LUT can be added to the output of the pipelined ADC to remove the error and correct the lack of accuracy caused by non-linearity in the DACs. Specifically, step size errors (differential non-linearity), offset and gain errors are measured and corrected digitally.

Through this method, the accuracy requirement of the DACs (105) used in the pipelined ADC (100) is reduced making the circuit much easier and less expensive to build. Further details of this method will be explained in the following text.

Most ADC's described by FIG. 1 are generally thought of as being voltage mode converters. However, as noted above, a voltage mode pipelined ADC (100) as shown in FIG. 1 has many inherent disadvantages. For example, because the amplitude of the residue signal output by each summing block (106) is so small, the residue signal has to be amplified by an amplifier (107) prior to being input into a subsequent stage. The use of the amplifiers (107) may be costly, occupy valuable chip space, and consume undesirable amounts of power. A number of additional disadvantages may also exist.

Figure 2:
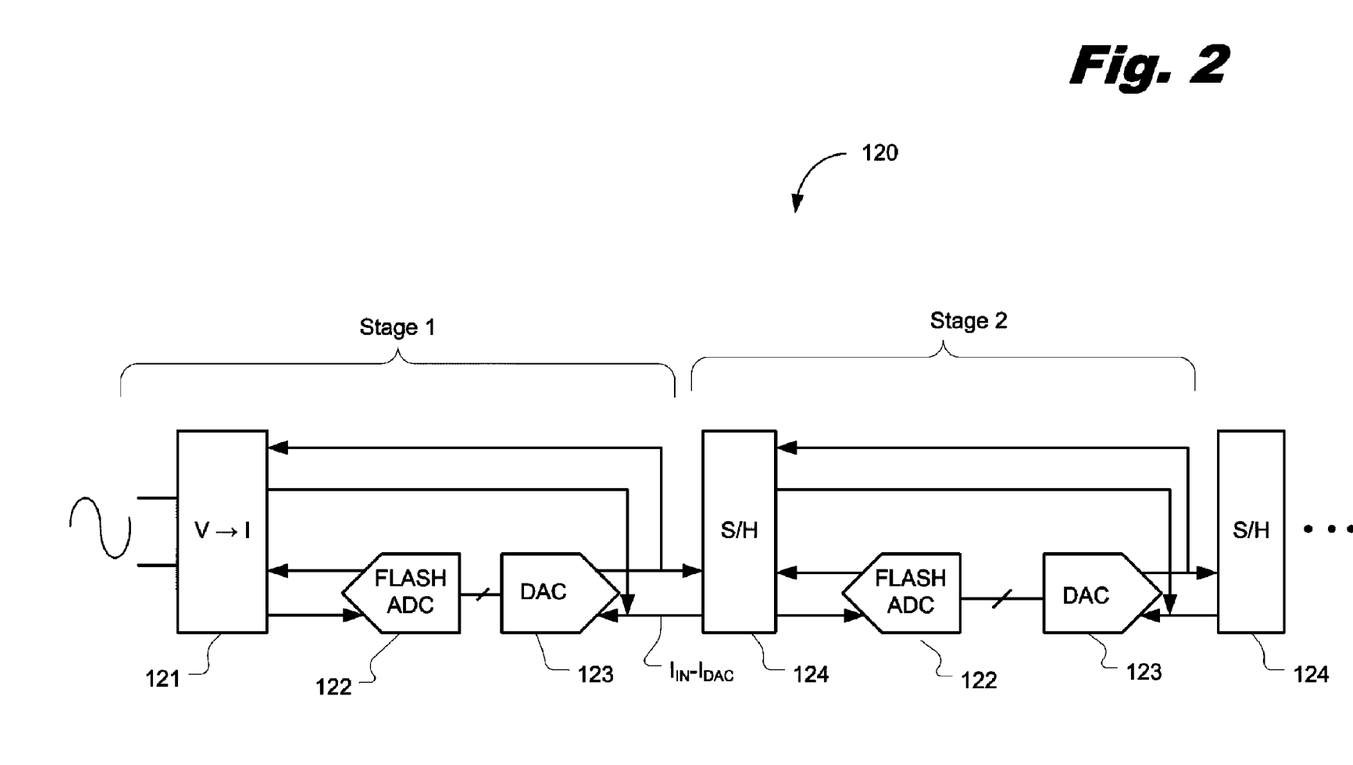
FIG. 2 illustrates an exemplary current mode pipelined ADC architecture according to principles described herein.

Hence, in some examples, a current mode pipelined ADC architecture may be used. For example, FIG. 2 illustrates an exemplary current mode pipelined ADC architecture (120) that may be used in accordance with the systems and methods described herein. It should be noted that FIG. 1 shows signals as functional blocks, whereas FIG. 2 shows a fully differential representation of the blocks and signals as they would be implemented.

As shown in FIG. 2, the current mode pipelined ADC (120) includes a number of stages. The first stage includes a voltage-to-current converter (121), a current mode flash ADC (122), and a DAC (123). Each of the remaining stages includes a S/H circuit (124), a current mode flash ADC (122), and a DAC (123). Each of these components will be described in more detail below.

As each stage includes a DAC (123), the DACs (123) serve as a source of error in the current mode pipelined ADC (120) in the manner described above. The techniques described herein can be applied to either a voltage mode or a current mode pipelined ADC (120) to correct for this error.

Returning to FIG. 2, an analog input signal is first input into the voltage-to-current converter (121), which converts the input signal from voltage to current. It will be recognized that in some instances, the signal is already represented in terms of current and therefore does not have to be converted by a voltage-to-current converter (121).

The voltage-to-current converter (121) may also be configured to function as a sample-and-hold circuit. In other words, the voltage-to-current converter (121) may be configured to sample the analog input signal and hold the value until it has been processed by the first stage (Stage 1). In some examples, the sample-and-hold function may be performed by an additional component placed in series with, either before or behind, the voltage-to-current converter (121).

Figure 3:
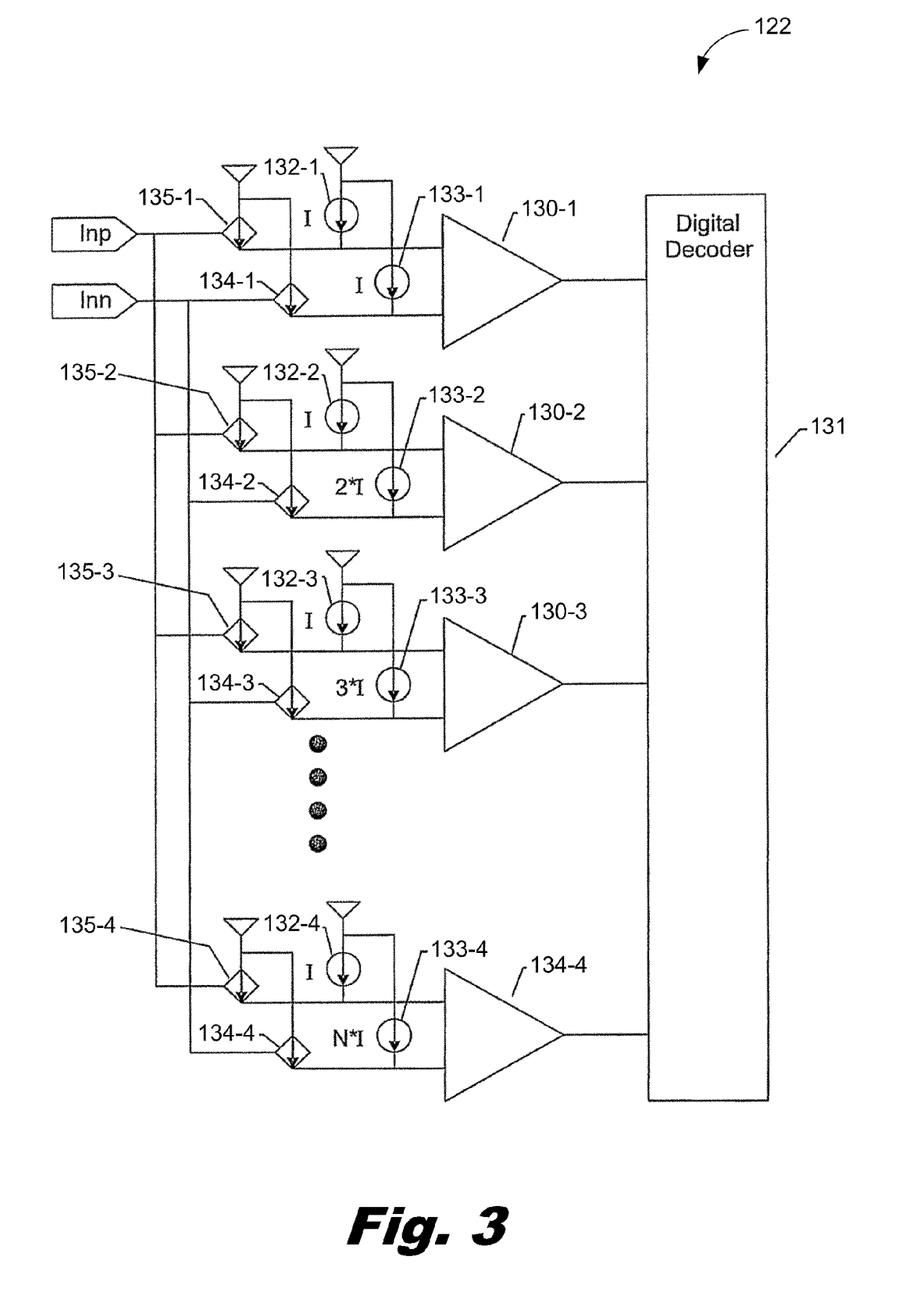
FIG. 3 shows an exemplary n-bit current mode ADC that may be used within the current mode pipelined ADC according to principles described herein.

The output signal (with current $I_{in}$) of the voltage-to-current converter (121) is then input into a current mode flash ADC (122). FIG. 3 shows an exemplary n-bit current mode ADC (122) that may be used within the current mode pipelined ADC (120). As shown in FIG. 3, current comparators (e.g., 130-1 through 130-4, collectively referred to herein as 130) are connected to a digital decoder (131). The comparators (130) each receive current inputs and convert them to a number of digital outputs. Elements 132-1 through 132-4 (collectively referred to herein as 132) are current sources that are configured to add a DC bias to each input signal. Elements 133-1 through 133-4 (collectively referred to herein as 133) are current sources with output currents scaled from I to N*I, where N is equal to $2^n$. Because the inputs to the comparators (130) are currents, elements 134-1 through 134-4 and 135-1 through 135-4 (collectively 134 and 135, respectively) are current controlled current sources having current equal to, or scaled versions of, input currents Inp and Inn, respectively, to allow for combining the currents into the comparators (130).

In some embodiments, the elements (133) may be replaced with mini-DACs, which will be described in more detail below. As used herein, the term mini-DAC is used to refer to a current output DAC. A mini-DAC can be used in place of some other current source.

In any event, calibration of the pipelined ADC may include changing the trip point at which the ADC (122) trips from one digital output to another based on a changed in the input analog signal. As described herein, controlling the trip point is done using the internal components of the ADC (122) illustrated in FIG. 3 or with mini-DACs replacing some of the internal elements pictures in FIG. 3.

Returning to FIG. 2, the digital output of the current mode flash ADC (122) is input into a DAC (123). The DAC (123) converts the digital signal into an analog signal ($I_{DAC}$) and, as described above, may introduce some error into the conversion. The amplitude of $I_{DAC}$ is typically very small, e.g., around 400 microamps. However, it will be recognized that the amplitude of $I_{DAC}$ may have any value as may serve a particular application.

Because the output signal of the DAC (123) is in terms of current, it can be subtracted directly from the output signal of the voltage-to-current converter (121) without the need for a summing block simply by electrically connecting the output of the DAC (123) to the output of the voltage-to-current converter (121). This connection may be referred to as a summing node. This subtraction results in a residue current signal having a current equal to $I_{in}-I_{DAC}$ that is input into a sample and hold (S/H) circuit (124) of the next stage (Stage 2).

In some examples, because the flash ADCs (122) in the pipelined ADC (120) are current mode ADCs, no amplification of the residual current is needed prior to being input into the S/H circuit (124) of the next stage. This is because the current mode ADCs (122) may be configured to be able to process very low amplitude signals. Hence, the current mode pipelined ADC (120) is advantageous in many applications.

As described above, the accuracy of both voltage mode and current mode pipelined ADCs (referred to herein collectively as pipelined ADCs) is at least in part dependent on the accuracy of the DACs and flash ADCs included within each stage. As described herein, error produced by the DACs can be corrected by measuring the DAC error in a calibration procedure that results in a correction signal that can be stored in a look-up table and added to the output of the pipelined ADC (120) to digitally correct for the error due to DAC nonlinearity or gain error. The error produced by the ADCs can be addressed by adjusting the trip point of each ADC as described herein.

Previously, efforts have been made to address DAC error by simply making the DAC more accurate. However, these techniques all have disadvantages. For example, in some applications, dynamic techniques such as current copying can be used, but these techniques do not take inaccuracies in gain, or scaling, into account. In some alternative applications, the dynamic sizes of the DACs may be statically matched. However, a disadvantage of this approach is that the devices must be very large, which decreases speed and increases power consumption. DACs may also be statically trimmed via fuse or laser processes. A disadvantage of this approach is that it does not compensate for drift due to voltage, temperature, and aging.

I. Calibration Philosophy

As noted in part above, the limiting factors in the static accuracy of a pipelined ADC include the accuracy of trip points in the ADCs (122, FIG. 2), the linearity of the front end, the linearity of the DACs, gain matching between stages, and the linearity and gain of the final ADC. As noted above and described herein, each block may be calibrated at power-on time or on-demand to compensate for these imperfections.

Regarding the accuracy of the ADCs in the first N−1 stages, if the comparator trip points (including any errors in the surrounding circuitry) in these ADCs are within ±½ LSB of their nominal values, so that the current into the next stage (nominally ±½ of full scale) does not exceed the full scale input current of the next stage, then the converter will operate properly, due to the digital error correction scheme described above. If any of the comparator trip points is outside the allowable ±½ LSB range, then the next stage will saturate, causing a large increase in Differential Non-Linearity (DNL) and possibly non-monotonicity.

As noted above, it is possible to calibrate the trip points of the comparators in these ADCs. This calibration may be performed at power-on time or on-demand to compensate for imperfect device matching and to ensure that the trip points are within the allowable ±½ LSB range. This may be in addition to characterization, with or without calibration, of the DACs in the pipelined ADC and digital compensation for any error factor caused by imperfect DACs.

The basic calibration scheme for the trip points of the ADCs is to calibrate the stages of the pipelined ADC starting with the least significant stage, i.e., the last stage. Then, we use the least significant stages to measure the inaccuracies in the most significant stages so that the proper calibration adjustment can be applied. Dithering and over-sampling are used to provide a resolution of less than one LSB of the converter for the calibration values to minimize the accumulation of errors.

II. Final Stage ADC Calibration

The linearity and monotonicity of the final stage flash ADC can be adjusted by trimming the reference current (133, FIG. 3) supplied to each of the comparators (130, FIG. 3) in the ADC (122, FIG. 3). In some examples, a reference DAC may be used to drive the input of the ADC so that each of the steps can be calibrated. The final ADC trip points may be calibrated to some fraction of an LSB, e.g., less than ⅛th of an LSB.

Figure 4:
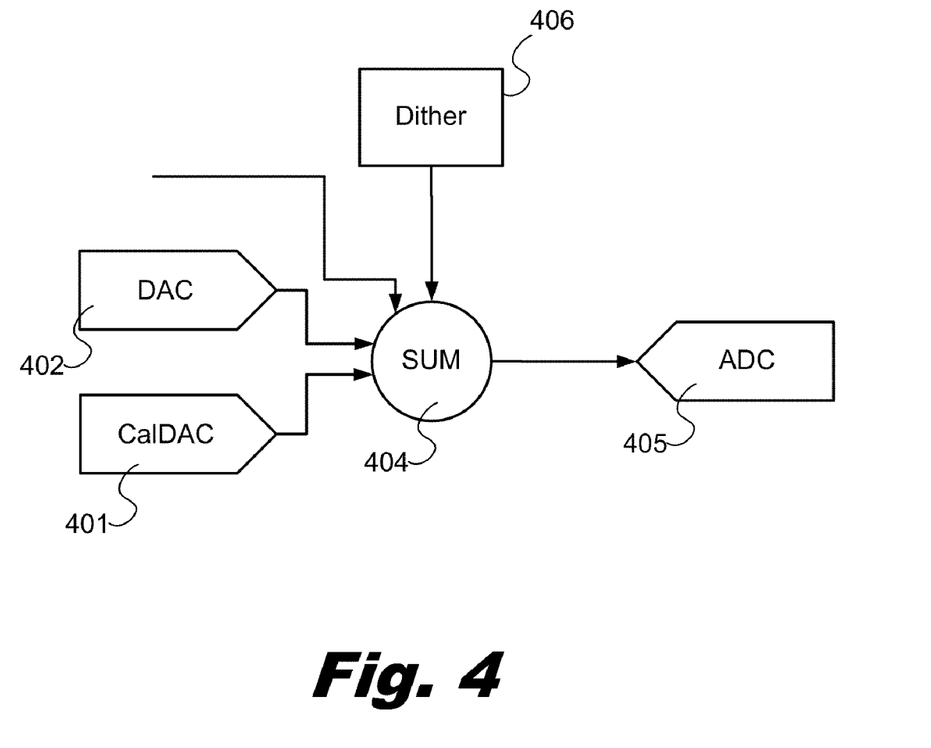
FIG. 4 illustrates an exemplary configuration wherein a reference DAC labeled CalDAC is used to calibrate one or more of the stages within the pipelined ADC according to principles described herein.

FIG. 4 illustrates an exemplary configuration in which a reference DAC labeled CalDAC (401) is used to calibrate one or more of the stages within the pipelined ADC (e.g., 120, FIG. 2). FIG. 4 shows the CalDAC (401) and the DAC (402) and ADC (405) of any of the stages of the pipelined ADC (120, FIG. 2). It will be appreciated, however, that only a single CalDAC (401) may be used to calibrate all the stages of the pipelined ADC (120, FIG. 2). Thus, it would not be necessary to provide a CalDAC (401) in each stage. Rather, switches or other devices, represented in FIG. 4 by the summing node (404) can be used to selectively add the output of the CalDAC (401) into any stage in the pipelined ADC (120, FIG. 2) that is currently, being calibrated. The CalDAC (401) outputs values corresponding to the desired ADC comparator trip points.

To calibrate the final stage of a pipelined ADC (e.g., 120, FIG. 2), the following method may be used. It will be recognized that the steps of the following method may be added to, omitted or rearranged as best suites a particular application.

Step 1: Disable the S/H circuit (124, FIG. 2) disposed between the third to last and second to last stages.

Step 2: Disable dither (406).

Step 3: Set the main DAC (402) in the second to last stage to a fixed value.

Step 4: Set CalDAC (401) to its first output value and sum (404) the output of the CalDAC (401) and the main DAC (402).

Step 5: Adjust the corresponding ADC comparator (405) trip point so that the comparator (405) just trips.

Step 6: If all comparators have been calibrated, then DONE, otherwise set CalDAC (401) to its next value and return to step 5.

III. ADC(N−1) Calibration

Referring again to FIG. 2, each of the flash ADCs in the pipelined ADC (120) other than the final one are calibrated so that each of their comparator trip points is close to +½ of the full scale input of the following stage. This is accomplished by iterating over the first M−1 DAC output values for the stage, and at each DAC output value, finding the input value to the upstream S/H that results in a +½ full scale current into the downstream S/H. While at this operating point, the comparator trip point for the next higher DAC code is adjusted until the comparator just trips.

Figure 5:
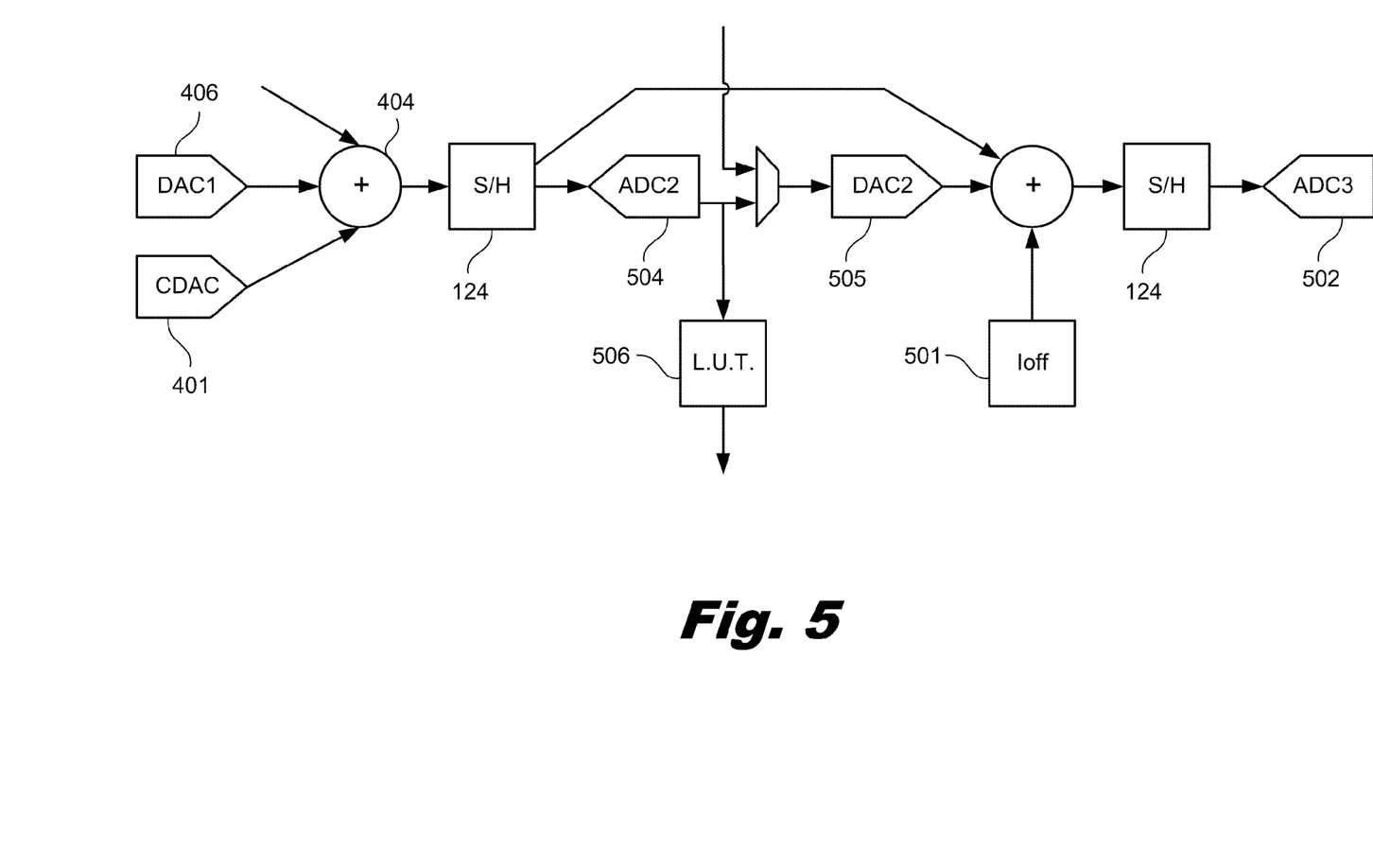
FIG. 5 shows an exemplary pipelined ADC configured to calibrate one or more of the ADCs and DACs within each of the stages according to principles described herein.

FIG. 5 shows an exemplary pipelined ADC configured to calibrate one or more of the ADCs and DACs within each of the stages. The current source Ioff (501) is used to fine tune the current level of the stage being calibrated relative to the downstream ADC trip points. It compensates for the ½ step offset between the nearest ADC3 comparator (503) trip point and the ideal value for the ADC2 comparator (504) trip point, the ½ step average offset in the output of CDAC, (401) and the ½ step average offset in the setting of the comparators (160, FIG. 3) or mini-DACs in ADC2 (504).

To calibrate ADC2 (504), for example, the following method may be used. It will be recognized that any additional or alternative method may be used to calibrate ADC2.

Step 1: Set DAC1 (406) to a known value.

Step 2: Disable the upstream S/H.

Step 3: Enable CDAC (401).

Step 4: Enable Ioff (501).

Step 5: Set DAC2 (505) input to code 0.

Step 6: Set the output value of CDAC (401) using a successive approximation algorithm and using the ADC3 comparator (502) for +½ scale.

Step 7: Adjust the mini-DAC for the ADC2 comparator (504) being calibrated using a successive approximation algorithm.

Step 8: If the second to last DAC2 code has been reached, then the ADC calibration is complete, otherwise increment the DAC2 (505) input code and return to step 6.

IV. DAC(N−1) Characterization

Additionally, as indicated above, rather than attempting to match all the current sources in a given DAC to each other, and to have a precise power of two relationship with the surrounding stages, the size of each DAC current step may be characterized and the mismatch error may be corrected digitally. The exact step sizes of a non-ideal DAC do not matter as long as the step sizes can be accurately measured so that a correction can be made to the final output of the pipelined ADC so that the converter, overall, remains monotonic and differential nonlinearity is small enough across each of the trip points of the flash ADCs in each of the upstream stages.

As mentioned above, the DAC characterization process will store the digital representation of the DAC current values in a lookup table (506) that is indexed by the DAC input code. The first entry in the lookup table is zero. The intent of the characterization process is to set the values in the lookup table such that at each of the ADC trip points or steps, the sum of the output of the lookup table value for that input code and the output value from the downstream stages will be the same no matter which way the ADC comparator votes.

To characterize DAC2 (505), the following method may be used. It will be recognized that any additional or alternative method may be used to characterize DAC2 (505) as may serve a particular application.

A) Setup
Set DAC1 (406) to a known value.
Disable the upstream S/H.
Enable the final stage dither circuit.
Enable CDAC (401).
Disable Ioff (501).
Clear DAC step size accumulator (S)
Set DAC2 code to 0.

B) Set the CDAC output value using a successive approximation algorithm and using the ADC2 comparator that selects between the current and next higher DAC2 codes.

C) Capture the error corrected output of the downstream stages in register CURRENT.

D) Increase the DAC2 code by 1.

E) Copy the value of CURRENT to the register PREVIOUS, and capture a new value in CURRENT.

F) Add the absolute value of the difference between CURRENT and PREVIOUS to the step size accumulator S.

G) Decrease the DAC2 code by 1.

H) Copy the value of CURRENT to the register PREVIOUS, and capture a new value in CURRENT.

I) Add the absolute value of the difference between CURRENT and PREVIOUS to the step size accumulator S.

J) Repeat steps D through I some power of 2 times, until sufficient accuracy is obtained.

K) The value in S is the digital representation of the value of the current+1 DAC2 code to a fraction of an LSB. Store this value in the corresponding slot in the lookup table (506).

L) If all of the lookup table entries have been filled, then the characterization of DAC2 is complete, otherwise increment the DAC2 code and return to step B.

V. Calibrating Remaining Stages

The procedures in Sections 3 and 4 described hereinabove may be repeated to calibrate the remaining stages in the pipelined ADC, starting with stage N−2. The only difference is that the calibration adjustment for a given stage is derived from the error-corrected sum of all of the downstream stages.

VI. Compensating for Front End Stage Nonlinearity

It is possible to partially compensate for front end nonlinearity by slightly adjusting the gain between the first and second stages depending on the where the front end is in its region of operation. With a three bit first stage, this allows the gain to be separately adjusted in eight different parts of the input range. The gain is adjusted by multiplying the input signal after the DAC1 current has been subtracted from it by a digital code word, and adding this current at the second stage summing node. The digital code word is obtained from a lookup table that is indexed by the output of the first flash ADC, so that different gain values can be used for each of the eight parts of the input range, and these gain values are determined by the calibration process. A precise voltage step is used as the calibration source, and the gain is adjusted in each region of operation so that the step sizes as seen by the downstream stages are identical.

Figure 6:
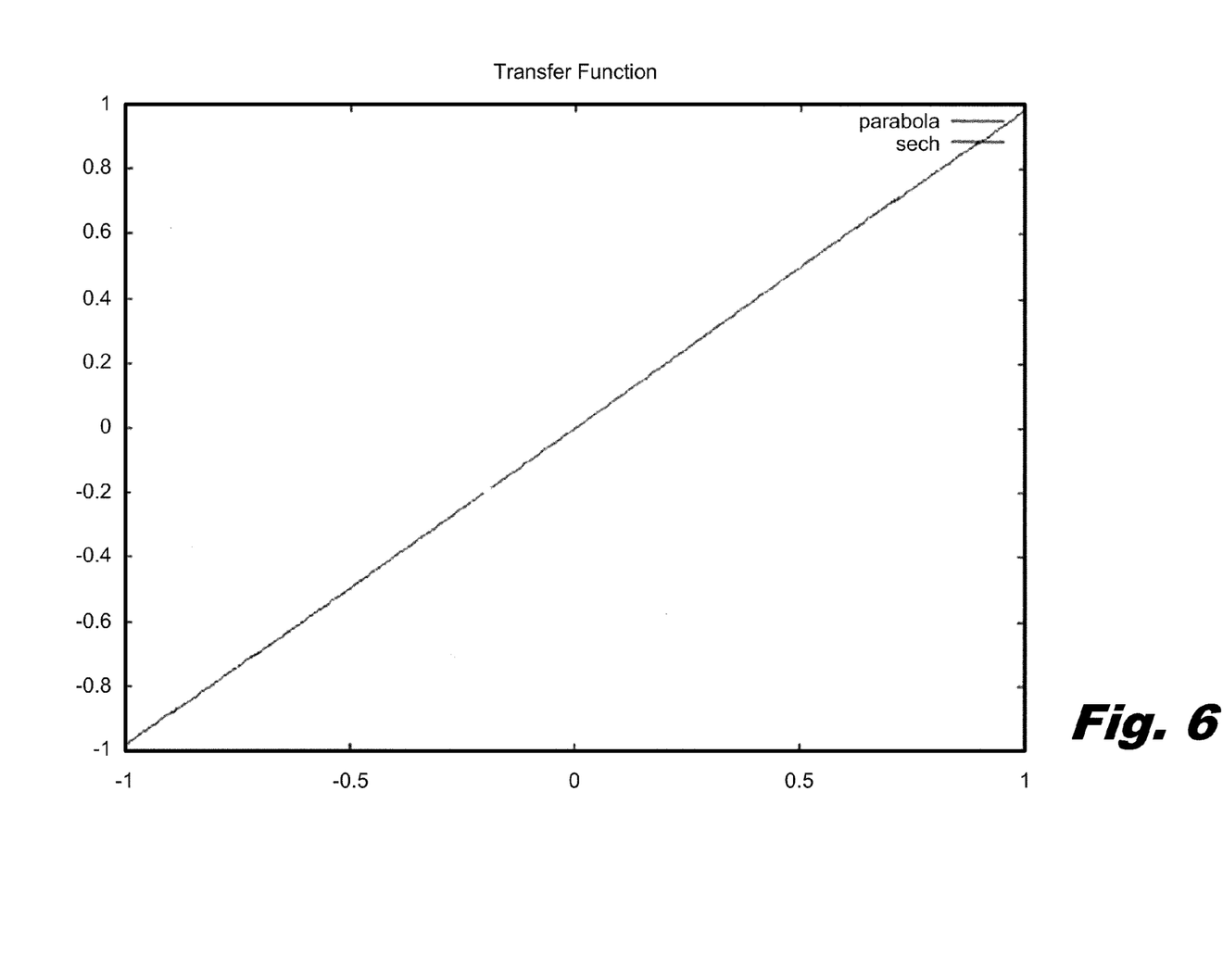
FIGS. 6-8 are plots illustrating the gain and transfer functions if the gain drops by 5 percent at the ends of the input range according to principles described herein.
Figure 7:
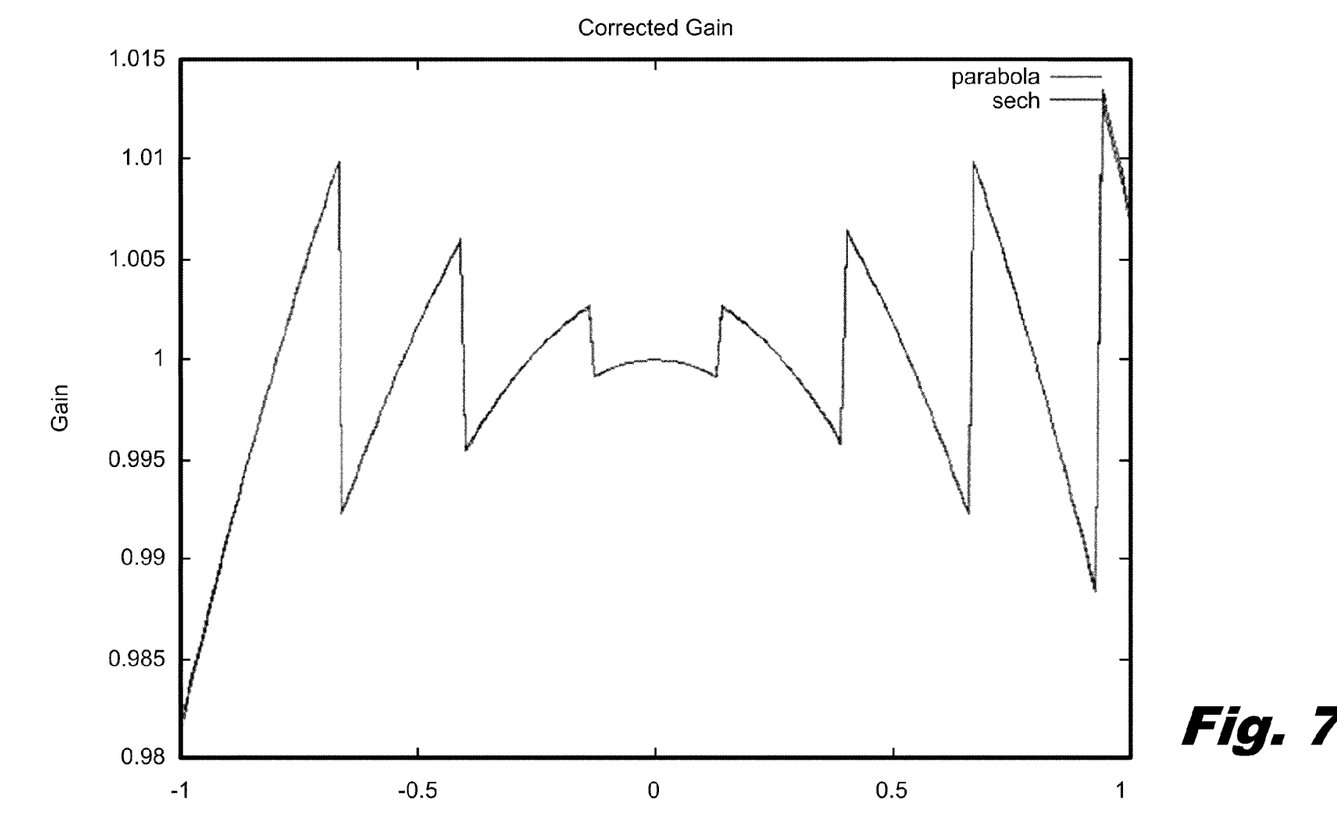
Figure 8:
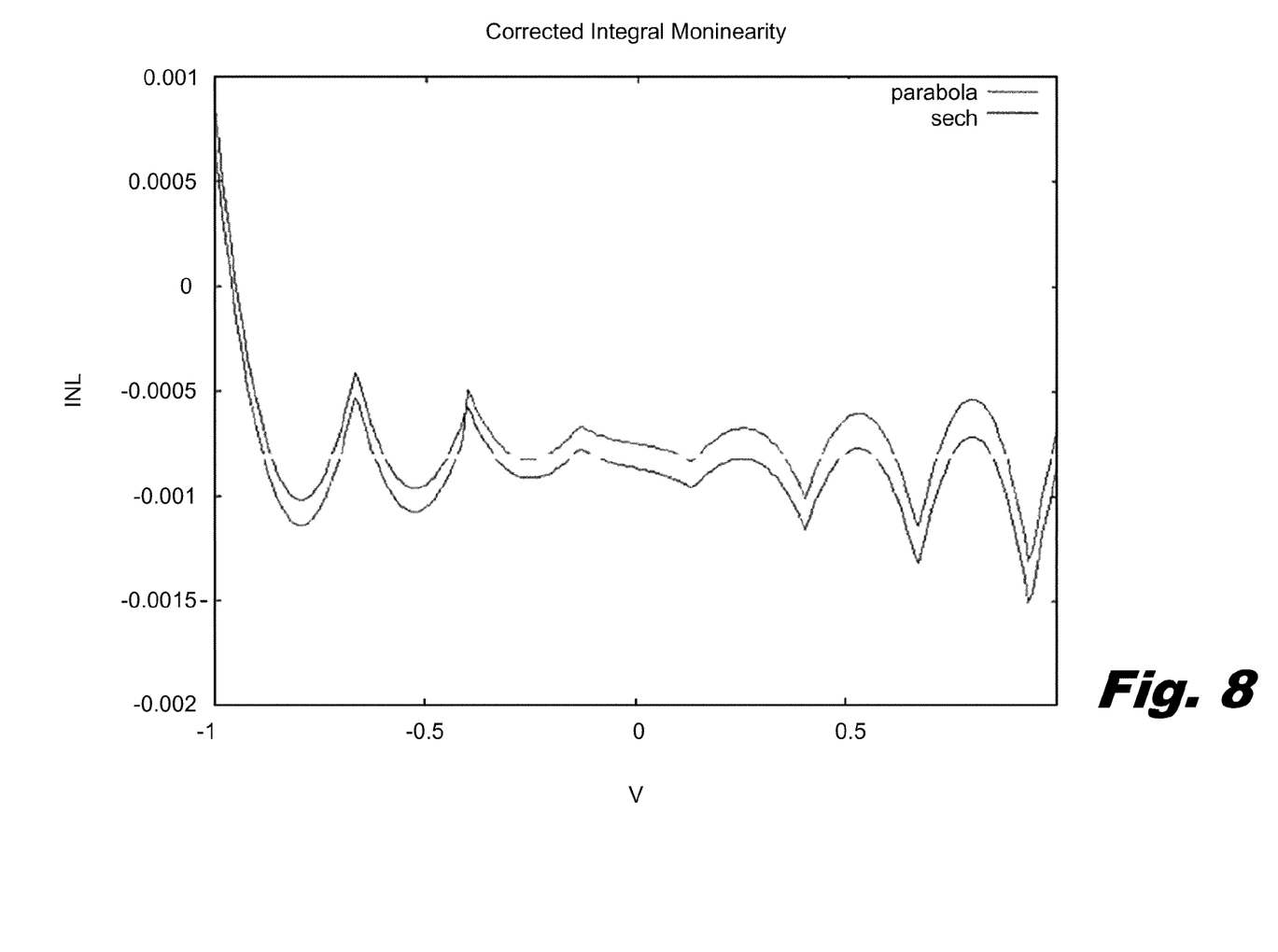

Assuming that no scaling is done, a simple model of the V/I gain is $1-a*V2$. The transfer function would be the integral of the gain, or $V-a/3*V3$. If the input range for V is ±1, the value of "a" would be the amount of gain droop at the extreme values of the input range. Another possible model for the V/I gain would be $sech(b*V)$, and the transfer function would be $atan(sinh(b*V))/b$. The value for b would be $sech-1(1-gain\_droop)$. The plots shown in FIGS. 6-8 illustrate the gain and transfer functions if the gain drops by 5 percent at the ends of the input range.

The integral nonlinearity is calculated by rescaling the transfer function so that the end points are rescaled to match the input and then subtracting the input from the rescaled output. With a gain droop of 5%, the INL limits the accuracy to about 7 bits.

The input range is divided into eight intervals. There are six equal size intervals in the middle, which produce an output from the first stage of −½ full scale to +½ full scale. The first interval produces an output from the first stage of −full scale to +½ full scale. To be symmetrical about zero, the last interval will only produce an output range of −½ full scale to 0. Neglecting nonlineary, the ADC1 trip points, which divide the input range will be at ±0.667, ±0.400, ±0.133, and +0.933. After the calibration procedure, the gain and INL plots appear as shown in FIGS. 7-8.

VII. Flowcharts

Figure 9:
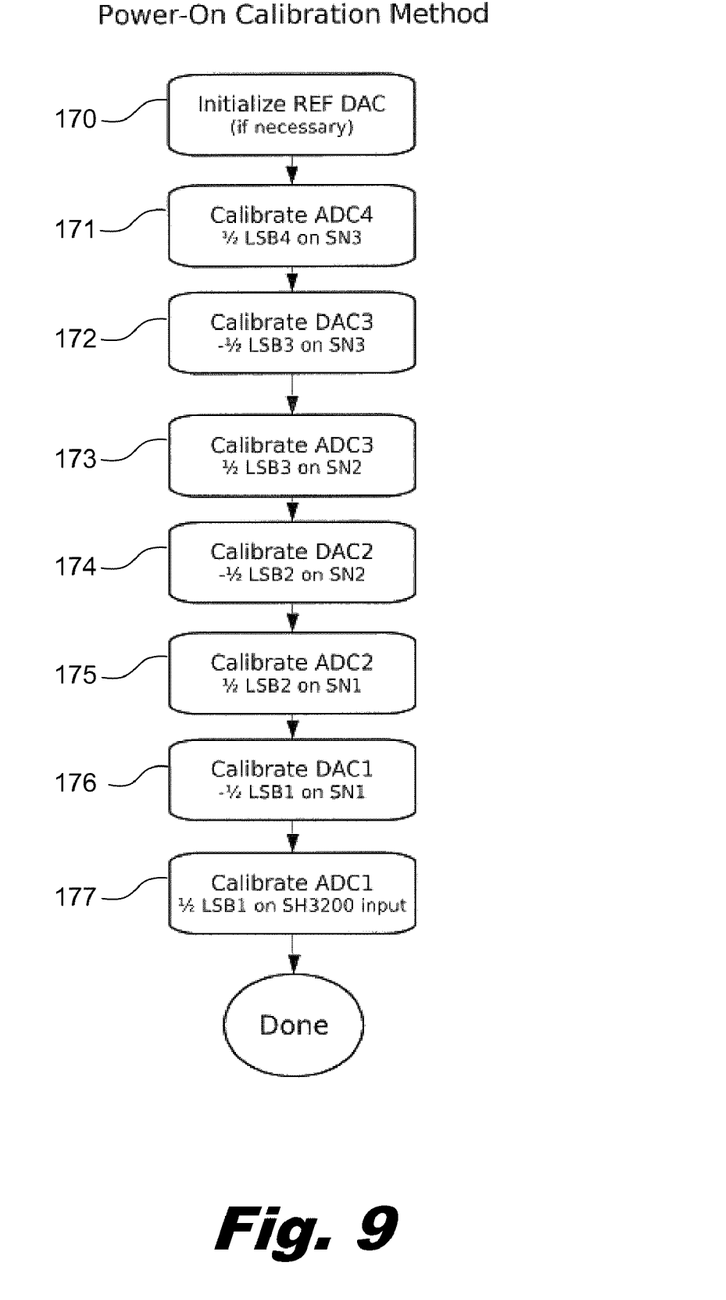
FIG. 9 is a flowchart showing one illustrative method of calibrating a pipelined ADC according to the principles described herein.

FIG. 9 is a flowchart showing one illustrative method of calibrating a pipelined ADC according to the principles described herein. As will be appreciated by those skilled in the art, the steps shown in FIG. 9 may be reordered or otherwise altered as best suits a particular application.

The illustrative method of FIG. 9 refers, for example, to a pipelined ADC having four stages, with an ADC and DAC paired in each stage as described herein. The stages are referred to here as stage 1, stage 2, etc. with stage 4 being the final stage of the pipeline. The method of FIG. 10 may be performed when the pipelined ADC is powered on.

As shown in FIG. 9, the method begins with initializing the reference DAC, also referred to herein as CalDAC, if needed. Next, the ADC in the fourth and final stage of the pipelined ADC (ADC4) is calibrated (171). The trip points of ADC4 are adjusted to be within ½ of the LSB of stage 4 at the summing node of stage 3 (SN3).

Next, the DAC of stage 3 (DAC3) is calibrated (172), meaning that its error factors are measured and recorded in a lookup table as described herein. This calibration is to correct the error factors of DAC3 within −½ of the LSB of stage 3 at the summing node of stage 3 (SN3).

Then, the ADC of stage 3 (ADC 3) is calibrated (173). The trip points of ADC3 are adjusted to be within ½ of the LSB of stage 3 at the summing node of stage 2 (SN2).

Next, the DAC of stage 2 (DAC2) is calibrated (174), meaning that its error factors are measured and recorded in a lookup table as described herein. This calibration is to correct the error factors of DAC2 within −½ of the LSB of stage 2 at the summing node of stage 2 (SN2).

Then, the ADC of stage 2 (ADC 2) is calibrated (175). The trip points of ADCs are adjusted to be within ½ of the LSB of stage 2 at the summing node of stage 1 (SN1).

Next, the DAC of stage 1 (DAC1) is calibrated (176), meaning that its error factors are measured and recorded in a lookup table as described herein. This calibration is to correct the error factors of DAC1 within ½ of the LSB of stage 1 at the summing node of stage 1 (SN1).

Then, the ADC of stage 1 (ADC 1) is calibrated (177). The trip points of ADC1 are adjusted to be within ½ of the LSB of stage 1 at the input of the sample-and-hold circuit (SH3200) of stage 1.

Figure 10:
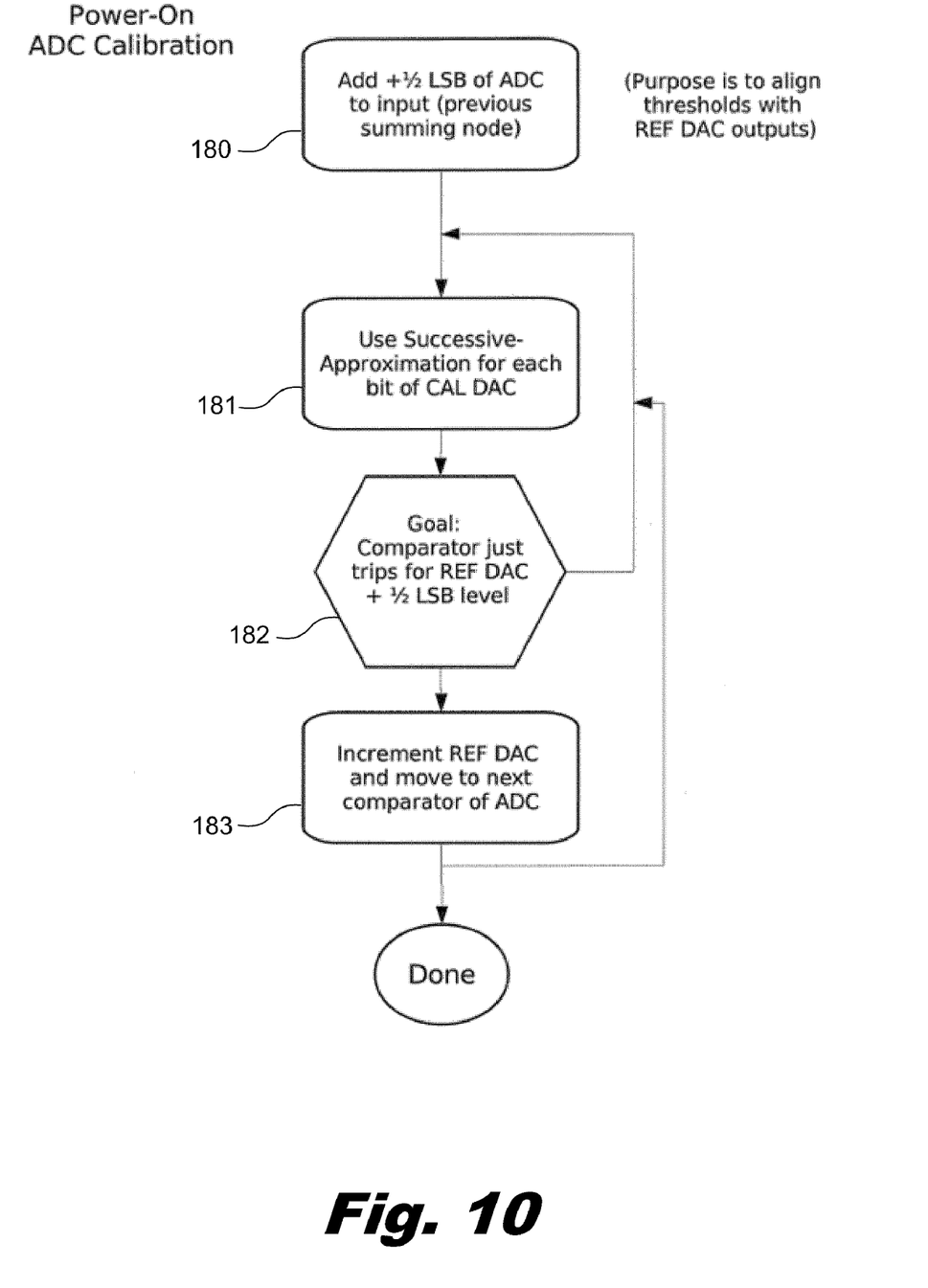
FIG. 10 is a flowchart showing one illustrative method of calibrating an ADC in a stage of a pipelined ADC according to the principles described herein.

FIG. 10 is a flowchart showing one illustrative method of calibrating an ADC in a stage of a pipelined ADC according to the principles described herein. As described above, calibrating an ADC is a stage of a pipelined ADC includes adjusting the trip points of that ADC to expected values. As will be appreciated by those skilled in the art, the steps shown in FIG. 10 may be reordered or otherwise altered as best suits a particular application.

As shown in FIG. 10, the method includes applying a reference signal from a reference DAC, also referred to herein as CalDAC, to the ADC being calibrated. The comparators (160, FIG. 3) or mini-DACs of the ADC are then adjusted to align a trip point of the ADC with the output from the reference DAC. This method may be performed when the pipelined ADC is powered on.

The example shown in FIG. 10 is for calibration of the ADC in the last stage of the pipeline. As explained above with reference to FIG. 10, the ADC of the last stage is calibrated first. The method includes adding +½ of the LSB of the ADC to the input of the summing node of the previous stage (180). The method further includes using successive approximation for each bit of the reference DAC output (181). The goal is adjust each comparator or min-DAC of the ADC to just trip for an output from the reference DAC at the +½ LSB level (182). The reference DAC is then incremented and the next comparator or mini-DAC of the ADC is adjusted in the same fashion (183) until the calibration of the ADC is complete (DONE).

VIII. Examples

A number of examples of pipelined ADC calibration will now be given. It will be recognized that the following examples are merely illustrative of the systems and methods described herein and that they are not limiting in any sense.

A. 3-bit Flash ADC Calibration Example

Each comparator in the 3-bit Flash ADC stage will have a 4-bit mini-DAC. The mini-DAC LSB is equal to ¼ of the ADC LSB. The comparator will be biased so that, in the absence of mismatch, a DAC code of 1000 will be correct. This way, a single mini-DAC will be able to compensate for offsets in either the positive or negative direction. Note that almost all mismatch will be within plus or minus 3 LSBs of 1000. The extra codes are insurance.

Due to biasing the comparator so that the code of 1000 is nominal, the mini-DAC had to be placed on different sides of the comparator (positive or minus), depending on the threshold.

The mini-DAC inputs are active low (because they are controlling PMOS switches), so the ports are called minidacin7b[3:0], for example.

We can think of the comparator threshold as being (Irefp−Irefm). The thresholds are at +14, +10, +6, +2, −2, −6, and −10. For the comparators with mini-DACs on the positive side, this becomes ((Irefp+Minidacoutput)−Irefm), so that increasing the mini-DAC code from 1000 to 1001 increases the threshold value, while decreasing the code from 1000 to 0111 decreases the threshold value.

For comparators with the mini-DAC on the minus side, the threshold is (Irefp−(Irefm+Minidacoutput)), or Irefp−Irefm−Minidacoutput, so that increasing the mini-DAC code from 1000 to 1001 decreases the threshold value. Decreasing the mini-DAC code from 1000 to 0111 increases the threshold value.

Comparator 7: miniDAC on positive side; nominal threshold +14

Comparator 6: miniDAC on positive side; nominal threshold +10

Comparator 5: miniDAC on positive side; nominal threshold +6

Comparator 4: miniDAC on positive side; nominal threshold +2

Comparator 3: miniDAC on minus side; nominal threshold −2

Comparator 2: miniDAC on minus side; nominal threshold −6

Comparator 1: miniDAC on minus side; nominal threshold −10

B. 5-bit Flash ADC Calibration Example

Each comparator in the 5-bit Flash ADC stage will have a 6-bit mini-DAC. The mini-DAC LSB is equal to ⅛ of the ADC LSB. The comparator will be biased so that, in the absence of mismatch, a DAC code of 100000 will be correct. This way, a single mini-DAC will be able to compensate for offsets in either the positive or negative direction.

Due to biasing the comparator so that the code of 100000 is nominal, the mini-DAC had to be placed on different sides of the comparator (positive or minus), depending on the threshold. For the comparators with mini-DACs on the positive side, increasing the mini-DAC code from 100000 to 100001 increases the threshold value, while decreasing the code from 100000 to 011111 decreases the threshold value. For comparators with the mini-DAC on the minus side, increasing the mini-DAC code from 100000 to 100001 decreases the threshold value. Decreasing the mini-DAC code from 100000 to 011111 increases the threshold value.

The mini-DAC inputs are active low (because they are controlling PMOS switches), so the ports are called minidacin7b[5:0], for example.

Comparators 31 to 16: miniDAC is on the positive side

Comparators 15 to 1: miniDAC is on the minus side

The 5-bit ADC is also configurable so that it can be converted to a 4-bit ADC or a 3-bit ADC. A two-bit interface configures the last stage ADC.

These signals will be called adc_config[1:0]

| bit1 | bit0 | Interpretation |
| --- | --- | --- |
| 0 | 0 | 3 bit ADC |
| 0 | 1 | 4 bit ADC |
| 1 | 0 | 5 bit ADC |
| 1 | 1 | Not Used |

The preceding description has been presented only to illustrate and describe embodiments of the invention. It is not intended to be exhaustive or to limit the invention to any precise form disclosed. Many modifications and variations are possible in light of the above teaching.

What is claimed is:

1. A method for increasing accuracy of a pipelined analog-to-digital converter comprising a plurality of stages, each stage comprising an analog-to-digital converter (ADC) and a digital-to-analog converter (DAC), said method comprising:

calibrating each said ADC starting from a least significant stage until all ADCs have been calibrated using a reference digital-to-analog converter, said reference digital-to-analog converter selectively outputting values at desired trip points for each said ADC;

measuring an output of each said DAC using downstream stages of said pipelined analog-to-digital converter to produce output measurements; and using said output measurements to calculate an error-corrected output of said pipelined analog-to-digital converter, in which said trip points are adjusted by modifying a reference current input to a comparator of each said ADC.

2. The method of claim 1, further comprising:

storing information from said output measurements in a look-up table; and generating a signal for correcting said output of said pipelined analog-to-digital converter using said look-up table.

3. The method of claim 2, wherein said signal for correcting said output of said pipelined analog-to-digital converter is a digital signal.

4. The method of claim 1, wherein said pipelined analog-to-digital converter is a current mode pipelined analog-to-digital converter.

5. A pipelined analog-to-digital converter comprising:

a plurality of stages, each stage comprising an analog-to-digital converter (ADC) and a digital-to-analog converter (DAC); and a look-up table containing data representing output values for each of said DACs;

in which trip points of said ADCs in said stages of said pipelined converter have been calibrated to expected values, in which each of said ADCs in said stages of said pipelined converter comprise comparators with reference inputs adjusted to calibrate said trip points.

6. The converter of claim 5, in which said reference inputs adjusted to calibrate said trip points are current sources.

7. The converter of claim 5, wherein each of said ADCs in said stages of said pipelined converter comprise current mini-DACs adjusted to calibrate said trip points.

8. The converter of claim 5, wherein said pipelined analog-to-digital converter is a current mode pipelined analog-to-digital converter.

9. The converter of claim 5, further comprising a reference DAC for outputting reference signals to said ADCs in said stages of said pipelined converter to generate the data stored in said look-up table.

10. The converter of claim 9, wherein:

an output of said reference DAC is summed with an output from a said DAC of a particular stage of said pipelined converter and an input to that DAC is stepped to enable measurement of a size of a DAC step for that DAC; and a look-up table entry for said DAC step comprises a sum of a measured value of said DAC step and a previously measured value for said DAC step.

11. A pipelined analog-to-digital converter comprising a plurality of stages, said pipelined analog-to-digital converter further comprising:

at least one stage comprising an analog-to-digital converter (ADC) and a digital-to-analog converter (DAC); and a look-up table containing data representing output values for said DACs;

in which a trip point of an ADC in said at least one stage of said pipelined converter has been calibrated to an expected value, in which said ADC in said at least one stage of said pipelined converter comprises a comparator with reference input adjusted to calibrate said trip point.

* * * * *